United States Patent
Bertrand et al.

(10) Patent No.: US 9,772,693 B2
(45) Date of Patent: Sep. 26, 2017

(54) ELECTRONIC DEVICE WITH MULTI-PURPOSE COMPONENT CIRCUMSCRIBING AN ELECTRONIC COMPONENT THEREOF

(75) Inventors: Nicole Bertrand, Fairport, NY (US);
David Cipolla, Macedon, NY (US);
Jose R. Duran, Williamson, NY (US);
Jason Scott, W. Henrietta, NY (US);
Richard S. Currier, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 971 days.

(21) Appl. No.: 13/552,866

(22) Filed: Jul. 19, 2012

(65) Prior Publication Data

US 2014/0021863 A1    Jan. 23, 2014

(51) Int. Cl.
*G06F 3/03* (2006.01)
*G06F 3/0354* (2013.01)
*H01L 23/057* (2006.01)

(52) U.S. Cl.
CPC ........ *G06F 3/0304* (2013.01); *G06F 3/03547* (2013.01); *H01L 23/057* (2013.01); *H01L 2924/0002* (2013.01)

(58) Field of Classification Search
CPC .. G06F 3/0304; G06F 3/03547; G06F 1/1656; G01D 11/28; H01L 23/28
USPC ............... 315/129; 345/156, 157, 176, 184; 53/410, 416, 409, 471
See application file for complete search history.

(56) References Cited

U.S. PATENT DOCUMENTS

| | | | | |
|---|---|---|---|---|
| 4,161,637 A | * | 7/1979 | Priesemuth | H01H 13/562 200/314 |
| 6,568,266 B1 | * | 5/2003 | Desa | G01L 19/0092 73/1.57 |
| 8,738,322 B1 | * | 5/2014 | Gioffre, II | G01G 5/02 702/173 |
| 2001/0054547 A1 | * | 12/2001 | Hattori | H01H 9/04 200/302.1 |
| 2009/0058802 A1 | * | 3/2009 | Orsley | H03K 17/975 345/157 |
| 2010/0025211 A1 | * | 2/2010 | Saito | H01H 9/181 200/339 |

(Continued)

*Primary Examiner* — Jimmy Vu
*Assistant Examiner* — Henry Luong
(74) *Attorney, Agent, or Firm* — Fox Rothschild LLP; Robert J. Sacco; Carol E. Thorstad-Forsyth

(57) ABSTRACT

Systems and methods (1400) for packaging an electronic component (108, 110) in an electronic device (100). The methods involve: circumscribing the electronic component with a multi-purpose component (120, 122) at least partially formed of a transparent material and a compressible material. A water tight seal is created by the multi-purpose component between the electronic component and a housing (102) of the electronic device. The multi-purpose component provides an indicator for indicating a location of the electronic component on the electronic device to a user thereof in dark or semi-dark environments. The indicator is provided by emitting light from the multi-purpose component. The multi-purpose component also communicates status information of the electronic device to the user by emitting light therefrom. Various types of status information can be communicated to the user by emitting different colored light from the multi-purpose component, respectively.

9 Claims, 9 Drawing Sheets

(56) References Cited

U.S. PATENT DOCUMENTS

2011/0051334 A1* 3/2011 Griffith .............. G06F 3/03547
                                                      361/679.01
2011/0141048 A1   6/2011 Brosnan et al.
2011/0267268 A1* 11/2011 Lum ................... G06F 3/03547
                                                      345/158
2012/0146926 A1*  6/2012 An ..................... G06F 3/03547
                                                      345/173

* cited by examiner

ELECTRONIC DEVICE WITH MULTI-PURPOSE COMPONENT CIRCUMSCRIBING AN ELECTRONIC COMPONENT THEREOF

BACKGROUND OF THE INVENTION

Statement of the Technical Field

The invention concerns electronic devices. More particularly, the invention concerns electronic devices comprising a multi-purpose component circumscribing an electronic component thereof (e.g., an input device, output device or electrical connector).

Description of the Related Art

Electronic devices having interfaces for facilitating user-software interactions are well known in the art. Such electronic devices include, but are not limited to, mobile phones, MP3 players, personal computers, Personal Digital Assistants ("PDAs"), game pads, digital cameras, Global Positioning System ("GPS") devices, biometric fingerprint sensor devices, and keyboards. The interfaces may include display screens, keypads, trackballs, joysticks, pointing sticks, buttons, scroll wheels, and Optical Finger Navigation ("OFN") devices.

An OFN device generally uses a light source to illuminate a navigation surface so that motion can be detected. In this regard, an OFN device typically comprises a Light Guide Film ("LGF"), a light source, and a sensor. The light source directs light into the LGF. The light source may be a Light Emitting Diode ("LED") or a laser. The LGF includes a finger interface surface to facilitate finger contact with the LGF. A finger's physical contact with the finger interface surface causes light to be reflected off of the finger in a direction towards and/or away from the sensor. The sensor generates images from the light directed thereto. Changes in the images generated by the sensor are interpreted as movement by the finger in contact with the LGF. In response to the detection of finger movement, signals are generated by the sensor including information specifying the finger's movement. Such information includes movement vectors (e.g., relative displacement values along an X axis and a Y axis). The signals are then communicated from the OFN to a microcontroller of an electronic device. At the microcontroller, operations are performed to cause corresponding movements of a navigation indicator to be seen on a display screen or to cause other computer functionality to be controlled in accordance with the finger movement. The navigation indicator often includes a cursor, a highlighter, or an arrow. The other computer functionality may include volume control, audio/video playback control, browser control, and game action control.

SUMMARY OF THE INVENTION

Embodiments of the present invention concern systems and methods for packaging an electronic component in an electronic device. The methods involve circumscribing the electronic component with a multi-purpose component at least partially formed of a transparent material and a compressible material. A water tight seal is created by the multi-purpose component between the electronic component and a housing of the electronic device. After the water tight seal is formed, the multi-purpose component and electronic component are retained in the housing such that only one side of the electronic component is accessible by a user of the electronic device. The retention can be achieved by: disposing a cap below the multi-purpose component and electronic device; and coupling a cap to the housing. Subsequently, the multi-purpose component provides an indicator for indicating a location of the electronic component on the electronic device to a user thereof in dark or semi-dark environments. The indicator is provided by emitting light from the multi-purpose component. The multi-purpose component also communicates status information of the electronic device to the user by emitting light therefrom. Various types of status information can be communicated to the user by emitting different colored light from the multi-purpose component, respectively.

BRIEF DESCRIPTION OF THE DRAWINGS

Embodiments will be described with reference to the following drawing figures, in which like numerals represent like items throughout the figures, and in which.

DETAILED DESCRIPTION

Figure 1:
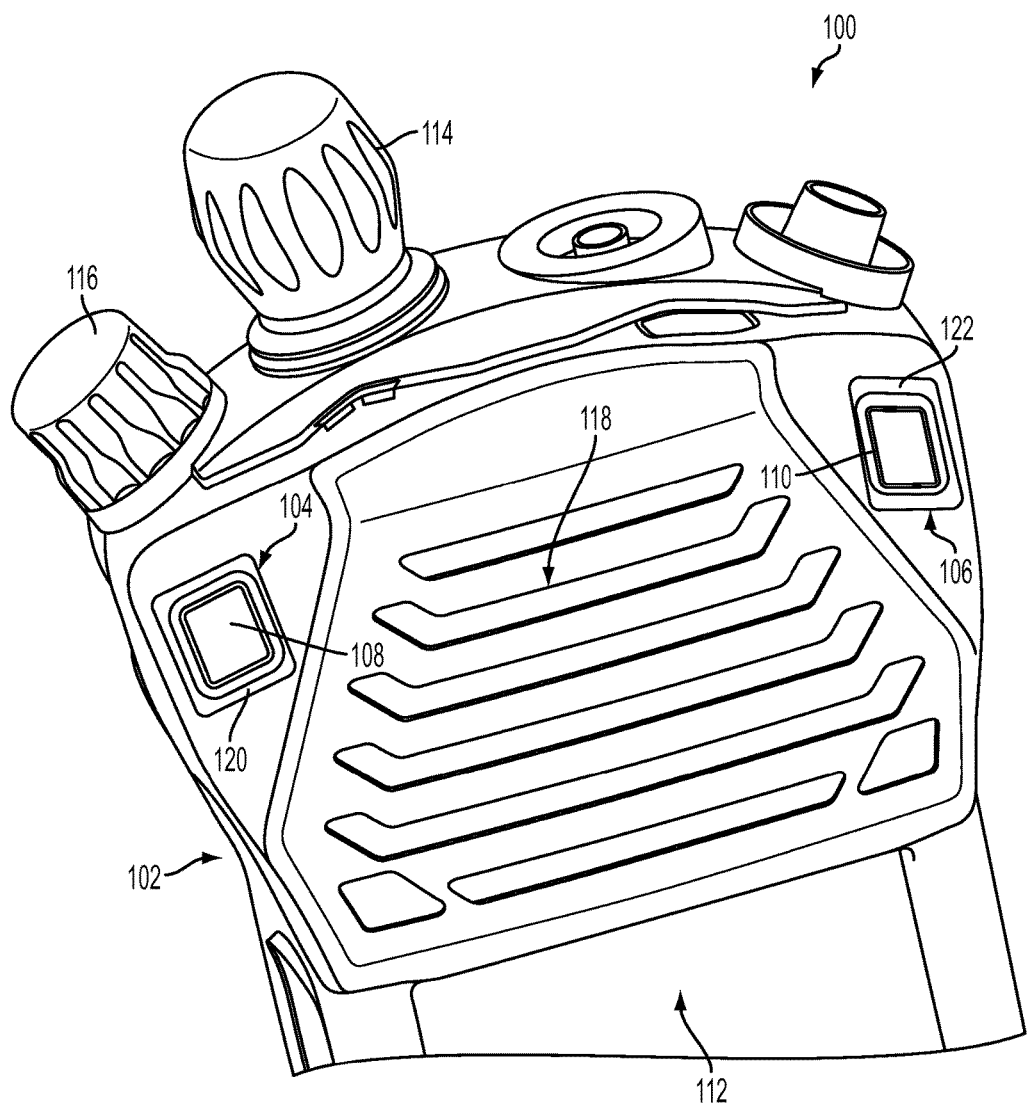
FIG. 1 is a schematic illustration of a cut away portion of an exemplary electronic device.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Furthermore, the described features, advantages and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Embodiments of the present invention will now be described with respect to FIGS. 1-13. Embodiments of the present invention generally relate to electronic devices comprising multi-purpose components circumscribing one or more input devices, output devices and/or electrical connectors thereof. Such electronic devices can include, but are not limited to, radios, mobile telephones, cellular telephones, MP3 players, personal computers, PDAs, game pads, video cameras, recording devices, digital cameras, GPS devices, sensor devices, keyboards and other electronic devices. The input devices can include, but are not limited to, display screens, buttons, OFN devices, trackballs, joysticks, pointing sticks, scroll wheels, microphones, keypads, cameras and biometric sensors. The output devices can include, but are not limited to, display screens and speakers. The electrical connectors can include, but are not limited to, antenna connectors, power plugs, Universal Serial Bus ("USB") connectors, BNC connectors and multi-pin connectors. Each of the listed input devices, output devices and electrical connectors is well known in the art, and therefore will not be described in detail herein.

Notably, the multi-purpose components are discussed herein in relation to OFN devices. Embodiments of the present invention are not limited in this regard. The multi-purpose components can be used in conjunction with any type of known or to be known input device, output device and electrical connector. All that is necessary is that the multi-purpose component be designed to circumscribe a respective input device, output device or electrical connector. In this regard, it should be understood that the multi-purpose component is configured to: (a) provide a water tight seal between a housing of an electronic device and an input device, output device or electrical connector; (b) provide an indication to a user as to a location of the input device, output device or electrical connector in dark or semi-dark environments; and (c) communicate various status information to a user of the electronic device via an emission of light. Such multi-purpose components are less costly, time consuming and complex to manufacture as compared to electronic devices comprising a corresponding plurality of single purpose components. Also, such multi-purpose components take up less space in an electronic device than would the corresponding plurality of single purpose components. Furthermore, such multi-purpose components weigh less than the collective weight of the corresponding plurality of single purpose components.

Referring now to FIG. 1, there is provided a schematic illustration of a cut away portion of an exemplary electronic device 100 that is useful for understanding the present invention. Although the electronic device 100 is shown to be a radio, the invention is not limited in this regard. For example, the electronic device 100 can be a radio, a mobile telephone, a cellular telephone, an MP3 player, a personal computer, a PDA, a game pad, a video camera, a recording device, a camera, a GPS device, a biometric fingerprint sensor device, a keyboard or any other electronic device.

As shown in FIG. 1, the electronic device 100 generally comprises a housing 102 configured to house circuits (not shown), a battery (not shown), and other electronic components (not shown). Housing 102 can be formed from any conductive or non-conductive material. Such conductive materials include, but are not limited to, metal materials and composite materials. Such non-conductive materials include, but are not limited to, rubbers and plastics. In some embodiments, the housing material is selected to withstand high temperatures and/or harsh environmental conditions such that the internal components of the electronic device 100 are protected from damage due to external factors.

The housing 102 has a plurality of apertures formed therethrough. Two of the apertures 104, 106 are sized and shaped so that OFN devices 108, 110 are accessible to a user of the electronic device 100. OFN devices are well known in the art, and therefore will not be described in detail herein. Still, it should be understood that the OFN devices 108, 110 facilitate user input to navigate content displayed on a display screen 112 of the electronic device 100. For example, the OFN devices 108, 110 may facilitate control of a navigation indicator (not shown) displayed on the display screen 112. The navigation indicator can include, but is not limited to, a cursor, a highlighter, or an arrow. Additionally or alternatively, the OFN devices 108, 110 facilitate user input to control other computer functionalities. For example, the OFN devices 108, 110 may facilitate control of command selection, radio parameter selection, talkgroup selection, and/or a volume level of sound.

The OFN devices 108, 110 may include any known or to be known OFN devices that can be immersed in water. For example, the OFN devices 108, 110 can include OFN devices available from AVAGO TECHNOLOGIES® of San José, Calif. An exemplary "AVAGO TECHNOLOGIES®" OFN device is described in detail in U.S. Patent Publication No. 2011/0141048 to Brosnan et al. ("Brosnan"). The discussion of OFN devices in Brosnan is sufficient for understanding the particularities and operations of the OFN devices 108, 110 of FIG. 1. In some embodiments, the OFN devices 108, 110 are designed with push activation.

Each OFN device 108, 110 is surrounded by a respective multi-purpose component 120, 122. Each multi-purpose component 120, 122 is configured to: (a) provide a water tight seal between the housing 102 of the electronic device 100 and a respective OFN device 108, 110; (b) provide an indication to a user as to a location of the respective OFN device 108, 110 in dark or semi-dark environments; and (c) communicate various status information to a user of the electronic device. The status information can be communicated to a user via an emission of different color lights. For example, the emission of green light from a multi-purpose component 120, 122 indicates that receive operations of the electronic device 100 are currently enabled even though a display screen 112 is turned "off" to save battery life. The emission of red light from a multi-purpose component 120, 122 indicates that a communication is currently being received by the electronic device 100. The emission of blue light from a multi-purpose component 120, 122 indicates that BLUETOOTH® operations of the electronic device 100 are currently enabled. The emission of a flashing light of any color from a multi-purpose component 120, 122 indicates that an emergency incident is or may be occurring. The emission of yellow light from a multi-purpose component 120, 122 indicates that a message is being received by the electronic device 100 in a Long Term Evolution ("LTE") mode. LTE mode is well known in the art, and therefore will not be described herein. Embodiments of the present invention are not limited to the particularities of the above presented example.

The multi-purpose components 120, 122 are illuminated via a light source (not shown). The light source is configured to provide light of various colors. The light source can include, but is not limited to, a tri-colored LED. The light source can be configured to turn "on" in pre-defined "low-light" conditions of an external environment, and turn "off" in pre-defined "high-light" conditions of the external environment. The "low-light" and "high-light" conditions of the external environment can be detected using a light sensor (not shown) and at least one threshold value. For example, a "low-light" condition can be detected when a sensed amount of light falls below a pre-defined threshold value. Likewise, a "high-light" condition can be detected when a sensed amount of light exceeds a pre-defined threshold value. Light sensors are well known in the art, and therefore will not be described herein.

The multi-purpose components 120, 122 can be manufactured in various ways. For example, the multi-purpose components 120, 122 can be manufactured in accordance with a 2-shot molding process, an overmolding process, and/or an injection molding process. Each of the listed molding processes are well known in the art, and therefore will not be described herein. Any known or to be known 2-shot molding, overmolding or injection molding process can be used to form the multi-purpose components 120, 122 without limitation.

Notably, in embodiments of the present invention, the multi-purpose components 120, 122 are coupled to the housing 102 of the electronic device 100 without the use of an adhesive. Consequently, the present invention provides water tight seals as a result of (a) a chemical and/or mechanical bond between the housing 102 and the multi-purpose components 120, 122, and/or (b) a chemical and/or mechanical bond between the multi-purpose components 120, 122 and the OFN devices 108, 110. The non-adhesive bonding feature of the present invention will become more evident as the discussion progresses.

Figure 2:
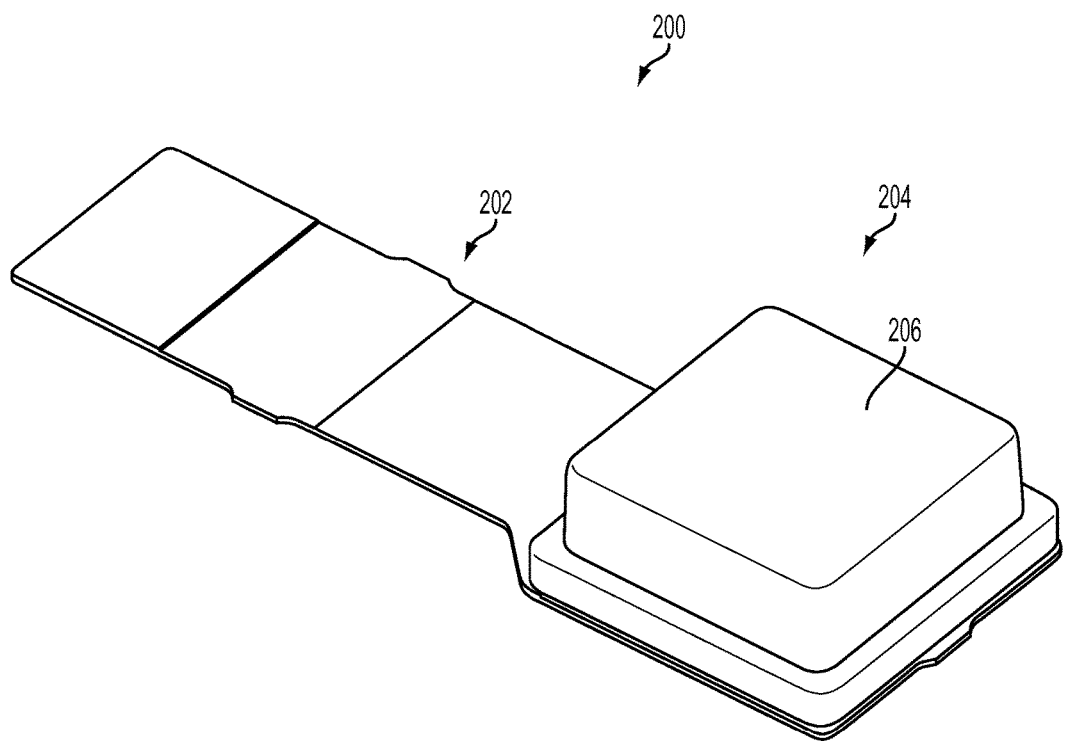
FIG. 2 is a schematic illustration of an OFN device that is useful for understanding the present invention.

Referring now to FIG. 2, there is provided a schematic illustration of an exemplary OFN device 200 that is useful for understanding the present invention. The OFN devices 108, 110 of FIG. 1 can be the same as or substantially similar to the OFN device 200. As shown in FIG. 2, the OFN device 200 comprises a flexible circuit board 202 coupled to an OFN component 204. The OFN component 204 generally uses a light source (not shown) to illuminate a navigation surface 206 so that finger motion can be detected. OFN components are well known in the art, and therefore will not be described in detail herein.

Figure 3:
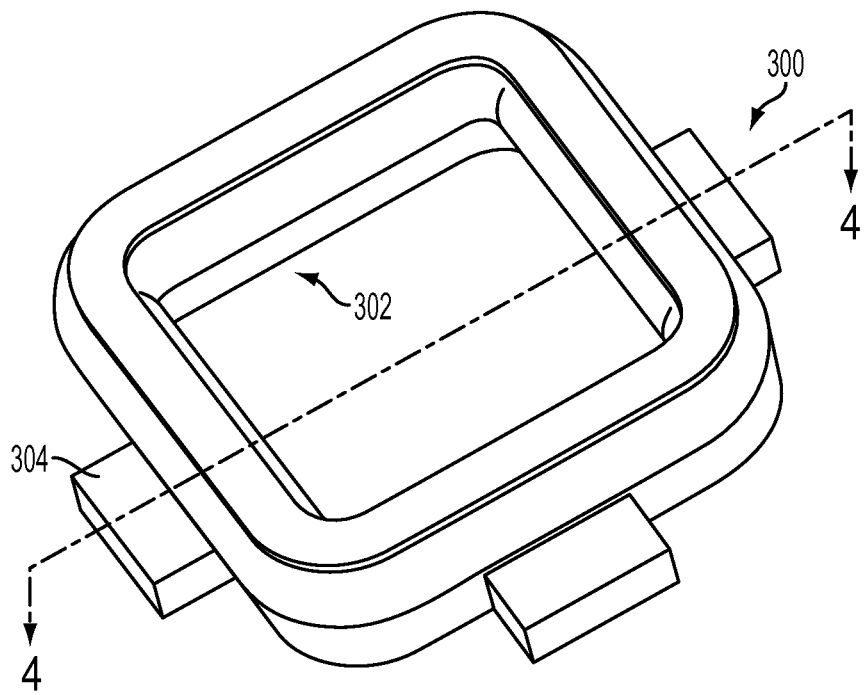
FIG. 3 is a schematic illustration of a first exemplary embodiment of a multi-purpose component.

Referring now to FIG. 3, there is provided a schematic illustration of a first exemplary embodiment of a multi-purpose component 300. The multi-purpose components 120, 122 of FIG. 1 can be the same as or substantially similar to the multi-purpose component 300. As shown in FIG. 3, the multi-purpose component 300 comprises a Seal and Light Pipe ("SLP") component 302 and mechanical retention features 304. The mechanical retention features 304 facilitate the mechanical coupling of the multi-purpose component 300 to the housing of an electronic device (e.g., electronic device 100 of FIG. 1). The manner in which the multi-purpose component 300 is coupled to a housing of an electronic device will be described in detail below in relation to FIG. 6.

Figure 4:
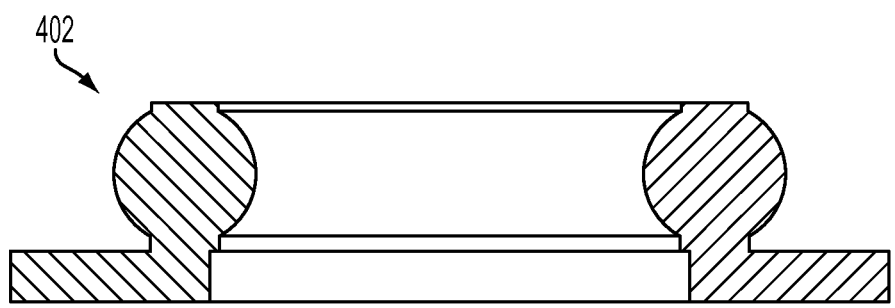
FIG. 4 is a cross-sectional view of the multi-purpose component taken along line 3-3 of FIG. 3.

The SLP component 302 is formed of a transparent, compressible material (e.g., silicone) such that it can operate in accordance with its intended purposes. For example, the SLP component 302 is configured to have gasket or o-ring sealing features which can provide a water tight seal between a housing of the electronic device and an input device, output device or electrical connector under relatively high fluid pressures. The gasket or o-ring sealing features of the SLP component 302 are facilitated by a circular cross-sectional profile of its main body 402, as shown in FIG. 4. Also, the SLP component 302 is configured to emit light for indicating to a user the location of the input device, output device or electrical connector in dark or semi-dark environments. The SLP component 302 is further configured to emit light of different colors for communicating various information to a user of the electronic device.

Figure 5:
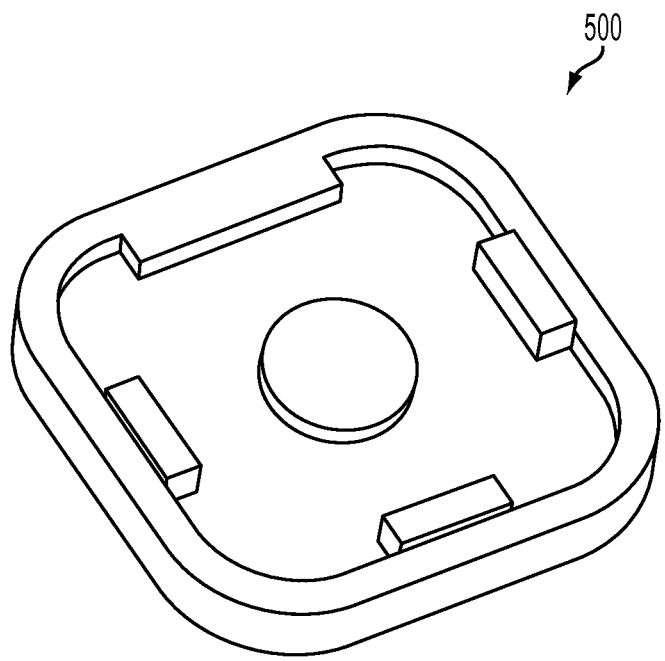
FIG. 5 is a schematic illustration of an exemplary cap for retaining an OFN device and a multi-purpose component in an aperture of an electronic device.

Referring now to FIG. 5, there is provided a schematic illustration of an exemplary cap 500. The cap 500 is configured to facilitate the retention of an OFN device (e.g., OFN devices 108, 110, or 200 of FIGS. 1-2) and a multi-purpose component (e.g., multi-purpose component 120, 122, or 300 of FIGS. 1 and 3) within an aperture (e.g., aperture 104 or 106 of FIG. 1) formed in a housing (e.g., housing 102 of FIG. 1) of an electronic device (e.g., electronic device 100 of FIG. 1). The retention can be achieved by coupling the cap 500 to sidewalls of the aperture of a housing in which the OFN device and multi-purpose component are disposed. In some embodiments, the coupling is achieved via an untrasonic weld. Notably, the cap 500 is formed of a clear material such that light emitted from a light source can pass therethrough. The clear material can include, but is not limited to, a plastic. The cap 500 is formed of a rigid material such that an OFN device can be supported thereby when it is depressed by a user thereof.

Figure 6:
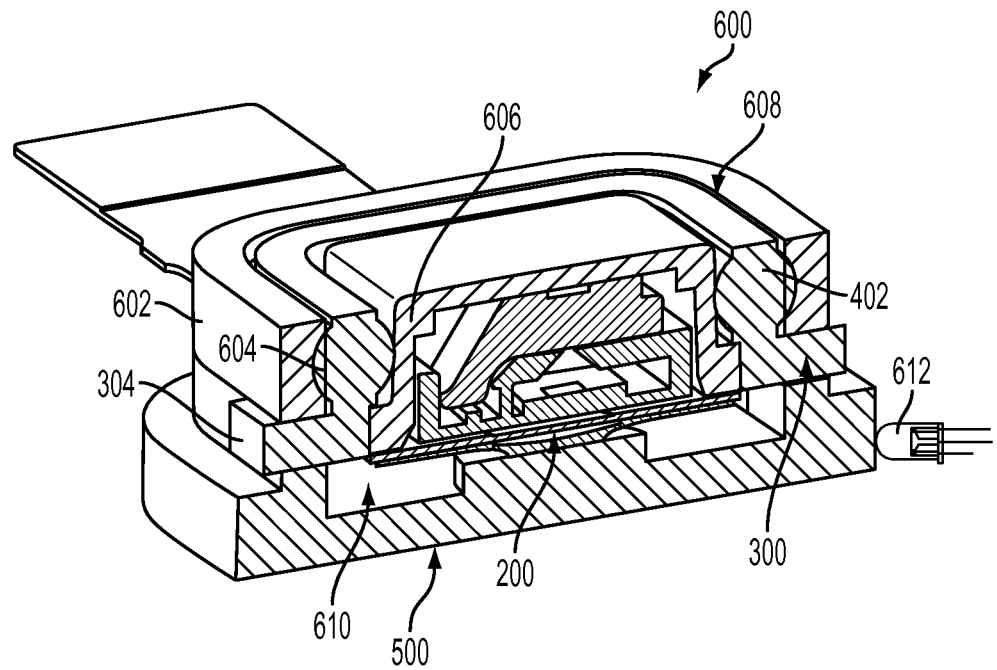
FIG. 6 is a cross-sectional view of an immersible OFN assembly.

Referring now to FIG. 6, there is provided a perspective cross-sectional view of an exemplary immersible OFN assembly 600 coupled to a portion 602 of a housing (e.g., housing 102 of FIG. 1) of an electronic device (e.g., electronic device 100 of FIG. 1). The OFN assembly 600 comprises the OFN device 200, the multi-purpose component 300, and the cap 500. As noted above, the OFN device 200 may be designed with push activation. In this scenario, the OFN device 200 moves in a downward direction (i.e., in and towards the electronic device) as a result of a user depression thereof and moves in an upward direction (i.e., out and away from the electronic device) when a user stops depressing the OFN device 200. The multi-purpose component 300 is designed such that it does not interfere with the up/down movement of the OFN device 200. In this regard, the multi-purpose component 300 is at least partially formed of an elastomeric material.

As shown in FIG. 6, the multi-purpose component 300 circumscribes the OFN device 200. The circumscription of the multi-purpose component 300 about the OFN device 200 facilitates the provision of a watertight seal between the OFN device 200 and the housing portion 602 of the electronic device. The watertight seal is formed by the main body 402, which is an elastomer with a disc-shaped cross-section. The main body 402 is seated in a space 608 formed between a sidewall 606 of the OFN device 200 and a sidewall 604 of the housing portion 602. The main body 402 is compressed during assembly between the sidewalls 604, 606, thereby creating the watertight seal at the interface thereof. In embodiments of the present invention, the percentage of compression falls within the range of ten percent to thirty percent.

Notably, the OFN device 200 and multi-purpose component 300 are retained within an aperture 610 of the housing portion 602. The retention is achieved by coupling the cap 500 to the housing portion 602 such that the mechanical retention features 304 of the multi-purpose component 300 are secured therebetween. The cap 500 can be coupled to the housing portion 602 via any suitable coupling means, such as an ultrasonic weld.

As noted above, the cap 500 and multi-purpose component 300 are formed of a transparent or clear material such that light emitted by the light source 612 passes therethrough. The light source 612 is shown to be an LED. Embodiments of the present invention are not limited in this regard. The light source 612 can include other types of known or to be known light emitting devices. The light source 612 is configured to emit light of a plurality of different colors. The different colored light can be used to convey various information to a user of the electronic device, as described above. Also, the emission of any color of light from the multi-purpose component 300 provides an indication to the user of the location of the OFN device 200 in dark or semi-dark environments.

Figure 7:
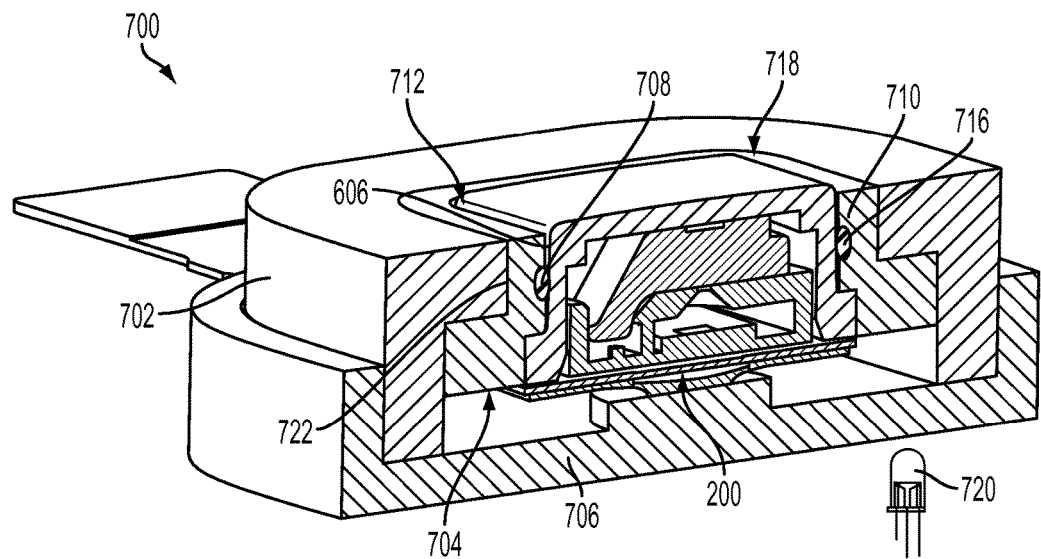
FIG. 7 is a perspective cross-sectional view of an exemplary immersible OFN assembly coupled to a housing of an electronic device.

Referring now to FIG. 7, there is provided a perspective cross-sectional view of another exemplary immersible OFN assembly 700 coupled to a portion 702 of a housing (e.g., housing 102 of FIG. 1) of an electronic device (e.g., electronic device 100 of FIG. 1). The OFN assembly 700 comprises the OFN device 200, a multi-purpose component 704, and a cap 706. In this embodiment, the multi-purpose component 704 is chemically and mechanically bonded to a sidewall surface 722 of a housing portion 702 of the electronic device. The chemical and mechanical bond can be provided during a 2-shot molding process. 2-shot molding processes are well known in the art, and therefore will not be described in detail herein. Any known or to be known 2-shot molding process can be used without limitation to form a multi-purpose component that is chemically and mechanically bonded to a housing of an electronic device. A perspective view of the multi-purpose component 704 bonded to the housing portion 702 is provided in FIG. 8. The chemical and mechanical bonds ensure that there is no path between the multi-purpose component 704 and the housing portion 702 for water or other fluids to travel, even when the electronic device is subjected to relatively high fluid pressure.

As noted above, the OFN device 200 may be designed with push activation. In this scenario, the OFN device 200 moves in a downward direction (i.e., towards the electronic device) as a result of a user depression thereof and moves in an upward direction (i.e., out from the electronic device) when a user stops depressing the OFN device 200. The multi-purpose component 704 is designed such that it does not interfere with the up/down movement of the OFN device 200. In this regard, the multi-purpose component 704 is formed of an elastomeric material (e.g., rubber or silicone).

As shown in FIG. 7, the multi-purpose component 704 circumscribes the OFN device 200. The circumscription of the multi-purpose component 704 about the OFN device 200 facilitates the provision of a watertight seal between the OFN device 200 and the multi-purpose component 704. The watertight seal is formed by the protrusion 708 of the main body 710 of the multi-purpose component 704. The protrusion 708 is an elastomer with a half disc-shaped cross-section. The protrusion 708 is seated in a space 712 existing between a sidewall 606 of the OFN device 200 and a sidewall 716 of the multi-purpose component 704. The protrusion 708 is compressed during assembly between the sidewalls 606, 716, thereby creating the watertight seal at the interface thereof. In embodiments of the present invention, the percentage of compression falls within the range of ten percent to thirty percent.

Figure 8:
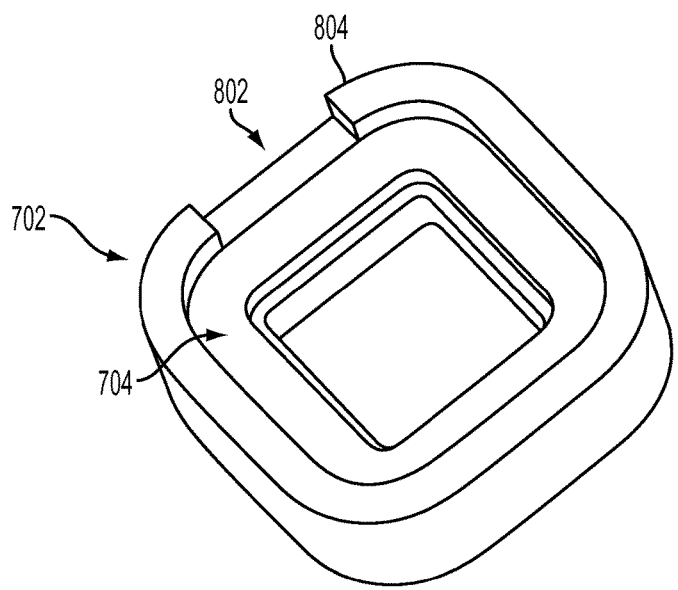
FIG. 8 is a perspective view of the multi-purpose component chemically and mechanically bonded to a housing portion of an electronic device.
Figure 9:
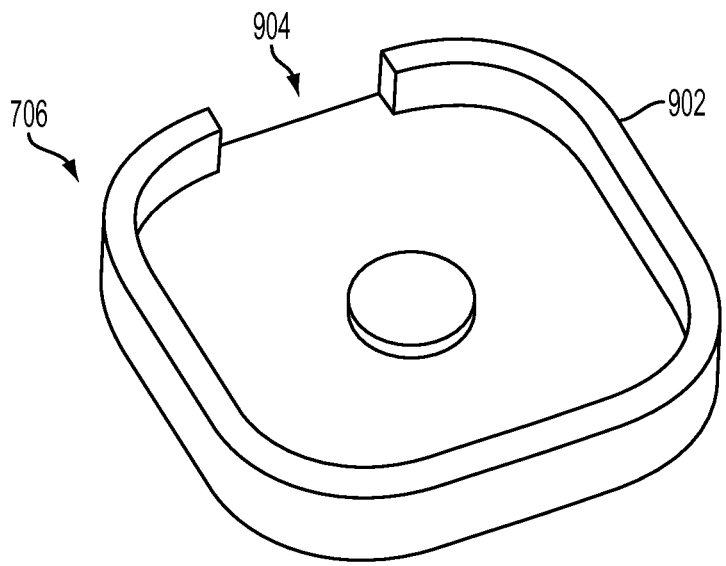
FIG. 9 is a perspective view of a cap shown in FIG. 7.

Notably, the OFN device 200 is retained within an aperture 718 of the multi-purpose component 704. The retention is achieved by coupling the cap 706 to the housing portion 702. In embodiments of the present invention, the cap 706 is coupled to the housing portion 702 via an ultrasonic weld. A perspective view of the cap 706 is provided in FIG. 9. As shown in FIG. 9, the cap 706 comprises a sidewall 902 having a gap 904 sized and shaped to allow a flexible circuit board 202 of the OFN device 200 to pass therethrough. Notably, as shown in FIG. 8, the housing portion 702 also comprises a gap 802 sized and shaped to allow the flexible circuit board 202 of the OFN device 200 to pass through a sidewall 804 thereof.

The cap 706 and multi-purpose component 704 are formed of a transparent or clear material such that light emitted by the light source 720 passes therethrough. The light source 720 is shown to be an LED. Embodiments of the present invention are not limited in this regard. The light source 720 can include other types of known or to be known light emitting devices. The light source 720 is configured to emit light of a plurality of different colors. The different colored light can be used to convey various information to a user of the electronic device, as described above. Also, the emission of any color of light from the multi-purpose component 704 provides an indication to the user of the location of the OFN device 200 in dark or semi-dark environments.

Figure 10:
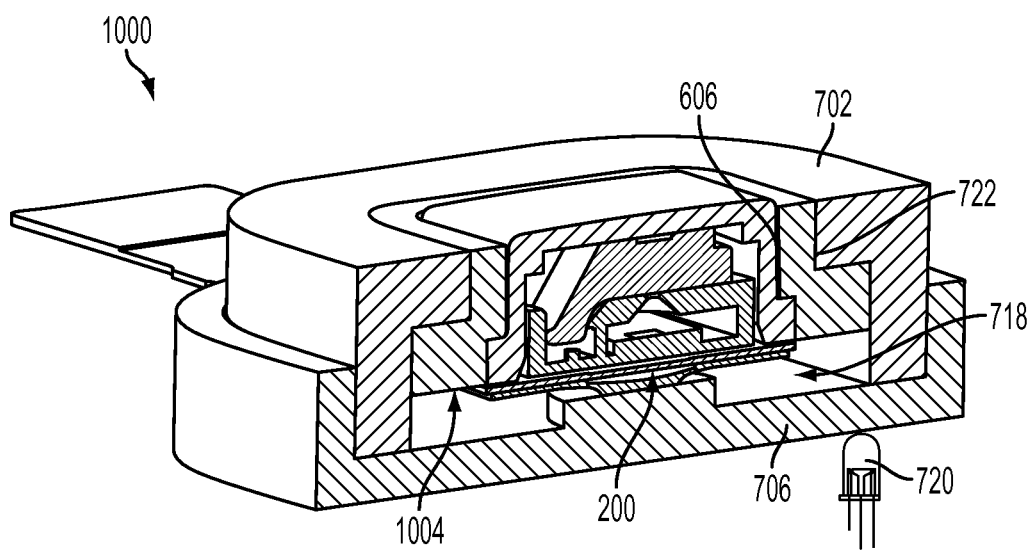
FIG. 10 is a perspective cross-sectional view of another exemplary immersible OFN assembly coupled to a housing of an electronic device.

Referring now to FIG. 10, there is provided a perspective cross-sectional view of another exemplary immersible OFN assembly 1000 coupled to a portion 702 of a housing (e.g., housing 102 of FIG. 1) of an electronic device (e.g., electronic device 100 of FIG. 1). The OFN assembly 1000 comprises the OFN device 200, a multi-purpose component 1004, and cap 706. In this embodiment, the multi-purpose component 1004 is chemically and mechanically bonded to (a) a sidewall 722 of the housing portion 702 of the electronic device and (b) a sidewall 606 of the OFN device 200. The chemical and mechanical bonds ensure that there are no paths between the multi-purpose component 1004, the housing portion 702 and the OFN device 200 for water or other fluids to travel, even when the electronic device is subjected to relatively high fluid pressure. The chemical and mechanical bonds also ensure that the OFN device 200 is retained in aperture 718. The retention of the OFN 300 may also be facilitated by cap 706.

The chemical and mechanical bonds can be provided during a secondary overmold process. Secondary overmold processes are well known in the art, and therefore will not be described in detail herein. Any known or to be known secondary overmold process can be used without limitation to form a multi-purpose component that is chemically and mechanically bonded to an OFN device and a housing of an electronic device. Care should be taken in the secondary overmold process such that the OFN device 200 is not damaged as a result of heat applied thereto. In this regard, the molding temperature is selected to have a value (e.g., one hundred twenty degrees) for ensuring that the OFN device 200 is not damaged during said secondary overmold process.

As noted above, the OFN device 200 may be designed with push activation. In this scenario, the OFN device 200 moves in a downward direction (i.e., towards the electronic device) as a result of a user depression thereof and moves in an upward direction (i.e., out from the electronic device) when a user stops depressing the OFN device 200. The multi-purpose component 1004 is designed such that it does not interfere with the up/down movement of the OFN device 200. In this regard, the multi-purpose component 1004 is formed of a compressible material (e.g., a low durometer rubber or silicone).

Notably, the OFN device 200 is supported by rigid cap 706 such that the chemical and mechanical bond between the OFN device 200 and the multi-purpose component 1004 is not broken when pressing forces are applied to the OFN device 200 by a user thereof. In embodiments of the present invention, the cap 706 is coupled to the housing portion 702 via an ultrasonic weld.

Similar to the multi-purpose components described above in relation to FIGS. 1-8, the multi-purpose component 1004 is formed of a transparent or clear material such that light emitted by the light source 720 passes therethrough. Different colored light can be emitted from the light source 720 for conveying various information to a user of the electronic device via the multi-purpose component 1004, as described above. Also, the emission of any color of light from the multi-purpose component 1004 provides an indication to the user of the location of the OFN device 200 in dark or semi-dark external environments.

Figure 11:
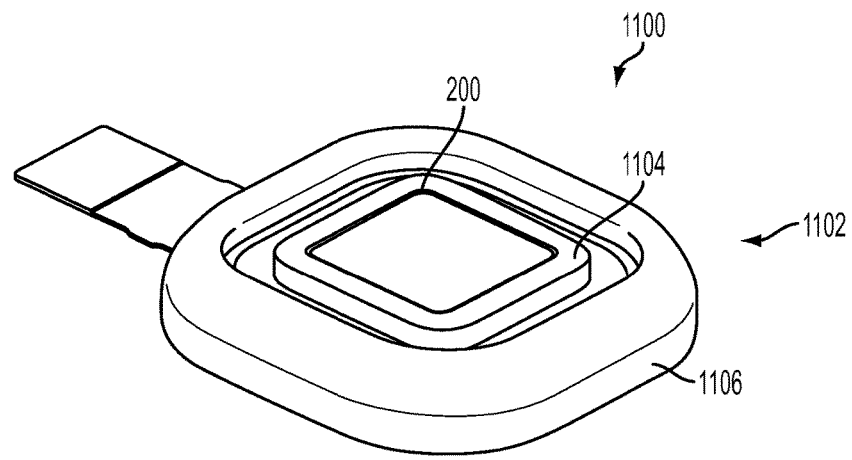
FIG. 11 is a perspective view of yet another exemplary immersible OFN assembly.
Figure 12:
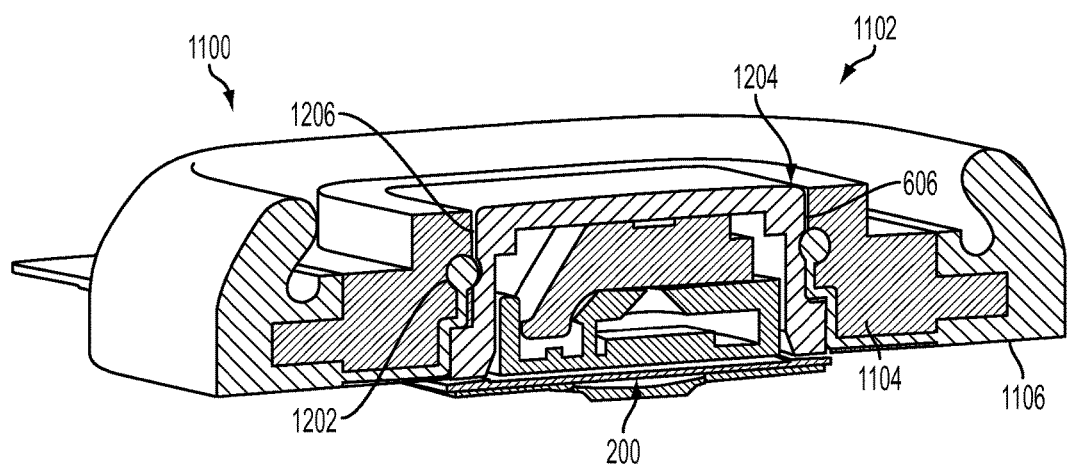
FIG. 12 is a perspective cross-sectional view of the immersible OFN assembly shown in FIG. 11.

Referring now to FIG. 11, there is provided a perspective view of yet another exemplary immersible OFN assembly 1100. A perspective cross-sectional view of the OFN assembly 1100 is provided in FIG. 12. In FIGS. 11-12, a housing portion and a cap are not shown for purposes of clarity. Still, it should be understood that the multi-purpose component 1102 and the OFN device 200 are retained in an aperture formed in the housing (e.g., housing 102 of FIG. 1) of an electronic device (e.g., electronic device 100 of FIG. 1) in the same manner or substantially similar manner to that described above in relation to FIGS. 6, 7 and/or 10.

As shown in FIGS. 11-12, the multi-purpose component 1102 comprises a collapsible sealing portion 1106, a light-pipe portion 1104 and a gasket portion 1202. The light-pipe portion 1104 and gasket portion 1202 circumscribe the OFN device 200. The collapsible sealing portion 1106 circumscribes the light-pipe portion 1104. The collapsible sealing portion 1106 and gasket portion 1202 are chemically and mechanically bonded to the light-pipe portion 1104 during a molding process. The chemical and mechanical bonds between the gasket 1202 and light-pipe 1104 ensure that there is no path therebetween for water or other fluids to travel, even when the electronic device is subjected to relatively high fluid pressure. Similarly, the chemical and mechanical bonds between the collapsible sealing member 1106 and light-pipe 1104 ensure that there is no path therebetween for water or other fluids to travel, even when the electronic device is subjected to relatively high fluid pressure.

The molding process can include, but is not limited to, a 2-shot molding process. 2-shot molding processes are well known in the art, and therefore will not be described herein. Any known or to be known 2-shot molding process can be used to form the multi-purpose component 1202 without limitation. However, it should be understood that the light pipe portion 1104 is formed in a first shot of the molding process using a transparent material (e.g., silicone). Thereafter, in a second shot of the molding process, the gasket portion 1202 and the collapsible sealing portion 1106 are formed using a compressible material (e.g., silicone). In some embodiments, the gasket portion 1202 and collapsible sealing portion 1106 are not formed of a transparent material, thereby ensuring that a substantially amount of light emitted from light source (not shown) passes through the light-pipe portion 1104.

As noted above, the OFN device 200 may be designed with push activation. In this scenario, the OFN device 200 moves in a downward direction (i.e., towards the electronic device) as a result of a user depression thereof and moves in an upward direction (i.e., out from the electronic device) when a user stops depressing the OFN device 200. The gasket 1202 is designed such that it does not interfere with the up/down movement of the OFN device 200. In this regard, the gasket 1202 is formed of an elastomeric material (e.g., a low durometer rubber or silicone) which circumscribes the OFN device 200. The circumscription of the gasket 1202 about the OFN device 200 facilitates the provision of a watertight seal between the OFN device 200 and the light-pipe 1104. The watertight seal is formed by the gasket 1202, which is an elastomer with a disc-shaped cross-section. The gasket 1202 is seated in a space 1204 formed between a sidewall 606 of the OFN device 200 and a sidewall 1206 of the light-pipe 1104. The gasket 1202 is compressed during assembly between the sidewalls 606, 1206, thereby creating the watertight seal at the interface thereof. In embodiments of the present invention, the percentage of compression falls within the range of ten percent to thirty percent.

The light-pipe 1104 is formed of a transparent or clear material such that light emitted by a light source (not shown) disposed under a transparent cap (not shown) 612 passes therethrough. The light source 612 may be configured to emit light of a plurality of different colors. The different colored light can be used to convey various information to a user of the electronic device, as described above. Also, the emission of any color of light from the light-pipe 1104 provides an indication to the user of the location of the OFN device 200 in dark or semi-dark environments.

Figure 13:
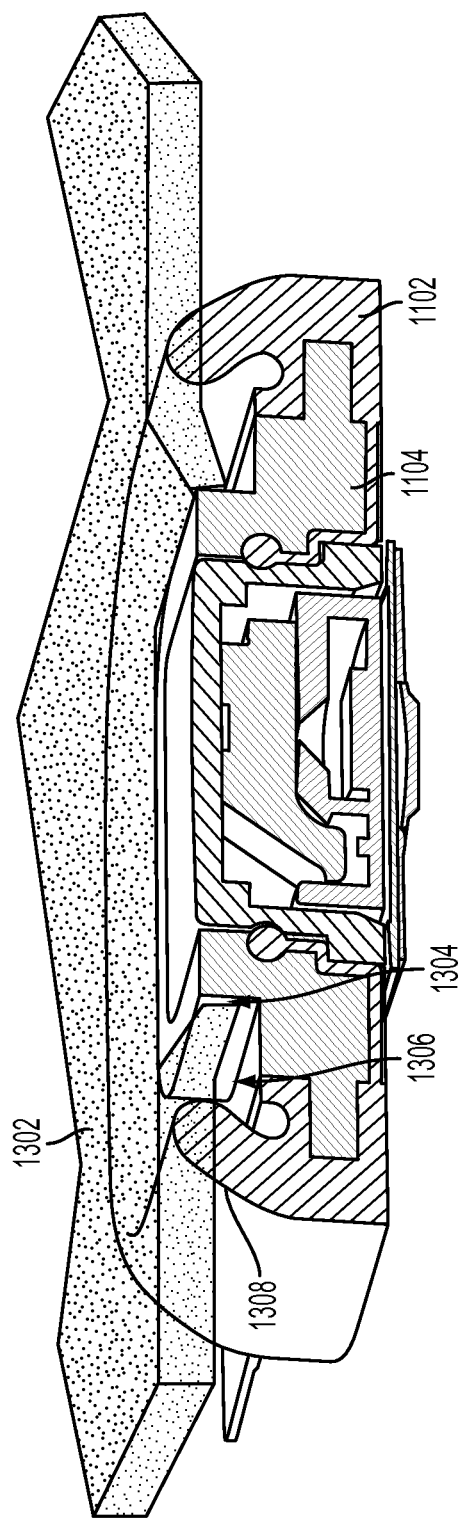
FIG. 13 is a perspective cross-sectional view of the immersible OFN assembly shown in FIG. 11 disposed in a housing of an electronic device.

Referring now to FIG. 13, there is provided a perspective cross-sectional view of the OFN assembly 1100 disposed within a housing of an electronic device (e.g., electronic device 100 of FIG. 1). As shown in FIG. 13, a gap 1304 is provided between the housing 1302 of the electronic device and the light pipe 1104. The gap 1304 allows water or other fluids to enter into an internal space 1306 such that fluid pressure is applied to a collapsible member 1308 of the collapsible sealing member 1102. In response to the fluid pressure, the collapsible member 1308 applies a sealing force on housing 1302. The amount of sealing force applied to the housing 1302 is varied based on the amount of fluid pressure applied to the collapsible member 1308. In this regard, it should be understood that the higher the fluid pressure the higher the sealing force.

In sum, there are various embodiments for the multi-purpose component of the present invention. Each embodiment is configured to accomplish at least three intended purposes. These intended purposes are: (a) provide a water tight seal between a housing of an electronic device and an input device, output device or electrical connector; (b) provide an indication to a user as to a location of the input device, output device or electrical connector in dark or semi-dark environments; and (c) communicate various information to a user of the electronic device via the emission of light.

Figure 14:
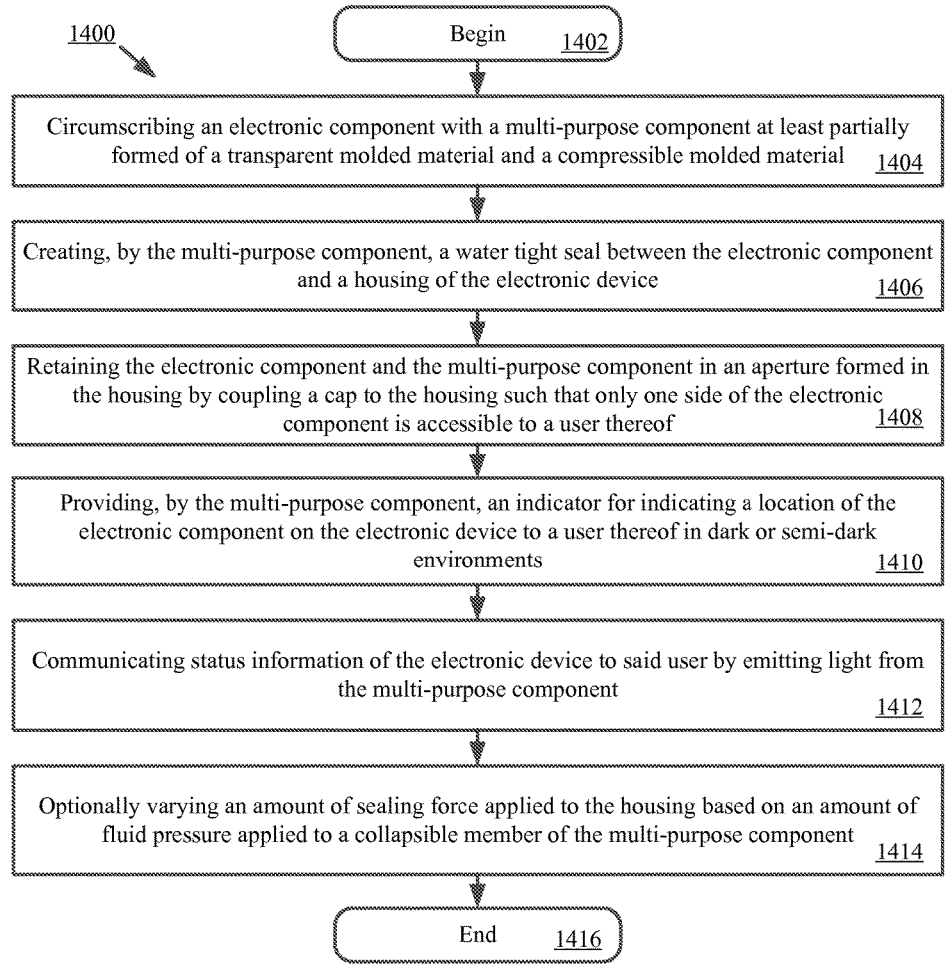
FIG. 14 is a flow diagram of an exemplary method packaging an electronic component in an electronic device.

Referring now to FIG. 14, there is provided a flow diagram of an exemplary method 1400 for packaging an electronic component (e.g., OFN device 108, 110, or 200 of FIGS. 1-2) in an electronic device (e.g., electronic device 100 of FIG. 1). The method 1400 begins with step 1402 and continues with step 1404. Step 1404 involves circumscribing the electronic component with a multi-purpose component (e.g., multi-purpose component 120, 122, 300, 704, 1004 or 1102 of FIG. 1, 3, 7, 10 or 11). The multi-purpose component is at least partially formed of a transparent molded material (e.g., rubber or silicone) and a compressible molded material (e.g., rubber or silicone).

As discussed above, the multi-purpose component can be formed via a molding process. During the molding process, a chemical bond and/or a mechanical bond between the multi-purpose component and the electronic component can be created. Consequently, the circumscription of step 1404 can be accomplished via a molding process. Alternatively the circumscription of step 1404 can be accomplished by inserting the electronic device into an aperture formed through the multi-purpose component. In this scenario, a gasket seal can be formed between the multi-purpose component and the electronic component.

In a next step 1406, a water tight seal is created by the multi-purpose component between the electronic component and a housing (e.g., housing 102, 602, 702 or 1302 of FIG. 1, 6, 7, 10 or 13) of the electronic device. Notably, the water tight seal can be formed in step 1404 instead of in a subsequent step 1406 as shown in FIG. 14. The water tight seal can be made via a molding process. During the molding process, a chemical bond and/or a mechanical bond is created between the multi-purpose component and a housing (e.g., housing 102, 602, 702 or 1302 of FIG. 1, 6, 7, 10 or 13) of the electronic device. Alternatively, the water tight seal can be made by inserting the multi-purpose component and electronic component assembly into an aperture formed through the housing of the electronic device. In this scenario, a gasket seal is created between the multi-purpose component and the housing of the electronic device.

Thereafter, in step 1408, the electronic component and multi-purpose component are retained in an aperture formed in the housing such that only one side of the electronic component is accessible to the user of the electronic device. The retention of step 1408 is achieved by coupling a cap (e.g., cap 500 or 706 of FIG. 5 or 9) to the housing. The cap can be coupled to the housing via an ultrasonic weld.

After retaining the electronic component and multi-purpose component in the housing, step 1410 is performed where an indicator is provided by the multi-purpose component. The indicator indicates a location of the electronic component on the electronic device to the user thereof in dark or semi-dark environments. The indicator is provided by emitting light from the multi-purpose component. The light can be provided by a light source (e.g., light source 612 or 720 of FIG. 6 or 7) disposed adjacent to the multi-purpose component within the electronic device. The light can be turned "on" in response to the detection of a "low light" condition by a sensor, as described above. Also, in step 1412, status information is communicated to the user by emitting light from the multi-purpose component. Notably, different status information can be communicated to the user via an emission of different colored light, as described above.

Upon completing step 1412, an optional step 1414 is performed. In optional step 1414, an amount of sealing force applied to the housing is varied based on an amount of fluid pressure applied to a collapsible member of the multi-purpose component. Subsequent to completing step 1412 or optional step 1414, step 1416 is performed where the method 1400 ends or other processing is performed.

All of the apparatus, methods, and algorithms disclosed and claimed herein can be made and executed without undue experimentation in light of the present disclosure. While the invention has been described in terms of preferred embodiments, it will be apparent to those having ordinary skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those having ordinary skill in the art are deemed to be within the spirit, scope and concept of the invention as defined.

We claim:

1. An electronic device, comprising:
    a housing;
    an electronic component disposed in an aperture formed through said housing;
    an aperture side wall extending from an exterior of the housing to an interior of the housing along a periphery of the aperture;
    a single multi-purpose component in direct contact with and circumscribing said electronic component so as to be disposed between the electronic component and an interior surface of the housing, said single multi-purpose component at least partially formed of a transparent material and a compressible material, said single multi-purpose component having a dual purpose of (1) providing a water tight seal directly between an exterior surface of said electronic component and the interior surface of said housing and (2) providing an indication of a location of said electronic component on said electronic device;
    said water tight seal created by said single multi-purpose component which is disposed along the periphery of the aperture between said electronic component and the aperture side wall of said housing so as to be in direct contact with both of said electronic component and said housing; and
    an indicator provided by said single multi-purpose component for indicating the location of said electronic component on said electronic device to a user thereof in dark or semi-dark environments, said indicator comprising a transparent portion of the water tight seal which peripherally extends to the exterior of the housing from a perimeter of the aperture defined by the aperture side wall.

2. The electronic device according to claim 1, wherein said indicator is provided by emitting light from said single multi-purpose component.

3. The electronic device according to claim 1, wherein said single multi-purpose component is configured to communicate status information of said electronic device to said user by emitting light therefrom.

4. The electronic device according to claim 1, wherein said single multi-purpose component is configured to communicate first status information to said user by emitting light of a first color therefrom and to communicate second status information of said electronic device to said user by emitting light of a second different color therefrom.

5. The electronic device according to claim 1, wherein a chemical bond is existent between said single multi-purpose component and at least one of said electronic component and said housing of said electronic device.

6. The electronic device according to claim 1, wherein a gasket seal is existent between said single multi-purpose component and at least one of said electronic component and said housing of said electronic device.

7. The electronic device according to claim 1, further comprising a cap coupled to said housing such that only one side of said electronic component is accessible to said user and such that said electronic component and said single multi-purpose component are retained in said aperture.

8. The electronic device according to claim 1, wherein said single multi-purpose component is designed to at least partially deform when the electronic component is actuated.

9. An electronic device, comprising:
   a housing;
   an electronic component disposed in an aperture formed through said housing;
   an aperture side wall extending from an exterior of the housing to an interior of the housing along a periphery of the aperture;
   a single multi-purpose component circumscribing said electronic component so as to be disposed between the electronic component and an interior surface of the housing, said single multi-purpose component at least partially formed of a transparent material and a compressible material, said single multi-purpose component having a dual purpose of (1) providing a water tight seal directly between an exterior surface of said electronic component and the interior surface of said housing and (2) providing an indication of a location of said electronic component on said electronic device;
   said water tight seal created by said single multi-purpose component disposed along the periphery of the aperture between said electronic component and the aperture side wall of said housing; and
   an indicator provided by said single multi-purpose component for indicating the location of said electronic component on said electronic device to a user thereof in dark or semi-dark environments, said indicator comprising a transparent portion of the water tight seal which peripherally extends to the exterior of the housing from a perimeter of the aperture defined by the aperture side wall;
   wherein said single multi-purpose component further comprises a collapsible member which is responsive to an amount of fluid pressure applied thereto to cause a variation in an amount of sealing force applied to said housing.

* * * * *